United States Patent [19]

Logan et al.

[11] Patent Number: 4,575,919
[45] Date of Patent: Mar. 18, 1986

[54] METHOD OF MAKING HETEROEPITAXIAL RIDGE OVERGROWN LASER

[75] Inventors: Ralph A. Logan, Morristown; Won-Tien Tsang, New Providence, both of N.J.

[73] Assignee: AT&T Bell Laboratories, Murray Hill, N.J.

[21] Appl. No.: 613,468

[22] Filed: May 24, 1984

[51] Int. Cl.[4] .......................... G02B 6/10; H01S 3/19; H01L 29/205
[52] U.S. Cl. .................................. 29/569 L; 29/576 J; 148/1.5; 148/171; 148/179; 148/DIG. 95; 148/DIG. 72; 427/85; 427/162; 357/16; 372/7; 372/43
[58] Field of Search .................. 29/569 L, 576 J, 578; 148/1.5, 171, 175, DIG. 95, DIG. 72; 427/85, 162; 372/43, 44, 7; 357/18, 16, 17

[56] References Cited
U.S. PATENT DOCUMENTS

| | | | |
|---|---|---|---|
| 4,023,993 | 5/1977 | Scifres et al. | 148/1.5 X |
| 4,045,749 | 8/1977 | Burnham et al. | 148/172 X |
| 4,073,676 | 2/1978 | Aiki et al. | 148/1.5 X |
| 4,178,604 | 12/1979 | Nakamura et al. | 29/576 E X |
| 4,376,138 | 3/1983 | Alferness et al. | 427/85 X |
| 4,420,873 | 12/1983 | Leonberger et al. | 29/576 E |

OTHER PUBLICATIONS

I. P. Kaminow, R. E. Nahory, M. A. Pollack, L. W. Stulz and J. C. Dewinter, "Single-Mode C. W. Ridge Waveguide Laser Emitting at 1.55 μm," *Electronics Letters,* 15, pp. 763-764 (1979).
H. Kawaguchi and T. Kawakami, "Transverse-Mode Control in an Injection Laser by a Strip-Loaded Waveguide," *IEEE Journal of Quantum Electronics,* QE-13(8), pp. 556-560 (1977).
W. T. Tsang, N. A. Olsson and R. A. Logan, "High-Speed Direct Single-Frequency Modulation with Large Tuning Rate and Frequency Excursion in Cleaved-Coupled-Cavity Semincoductor Lasers," *Applied Physics Letters,* 42(8) pp. 650-652 (1983).

*Primary Examiner*—Brian E. Hearn
*Assistant Examiner*—David A. Hey
*Attorney, Agent, or Firm*—Richard D. Laumann

[57] ABSTRACT

A method of making a ridge waveguide laser with the ridge being grown through a stripe opened in an oxide layer covering one of the cladding layers is described. In one embodiment, the cladding layer is corrugated and the ridge waveguide laser is a distributed feedback laser.

13 Claims, 9 Drawing Figures

METHOD OF MAKING HETEROEPITAXIAL RIDGE OVERGROWN LASER

TECHNICAL FIELD

This invention relates generally to semiconductor lasers and particularly to methods of making ridge waveguide and distributed feedback ridge waveguide semiconductor lasers.

BACKGROUND OF THE INVENTION

Optical communication systems have been and are of great commercial interest because of their high information carrying capacity. Such systems as presently contemplated use a light source which is optically coupled to a photodetector by a glass transmission line. The glass transmission line is commonly referred to as an optical fiber and is typically, at least at present, composed of a silica based composition. Such fibers presently exhibit extremely low loss and minimum chromatic dispersion within the wavelength range of 1.3 $\mu$m to 1.6 $\mu$m. Accordingly, although the original optical communication systems used wavelengths near 0.8 $\mu$m, much interest has shifted to the longer wavelengths between 1.3 $\mu$m and 1.6 $\mu$m because of their potentially greater usefulness for high data rate, long haul communications systems.

The light source presently contemplated for use in most optical communication systems is a semiconductor laser diode. In attempts to obtain desirable device characteristics, such as low threshold currents and high modulation rates, many semiconductor laser diode structures have been processed. One such structure is now termed a ridge waveguide laser by the skilled artisan and was first proposed and demonstrated in the AlGaAs materials system at a wavelength of approximately 0.8 $\mu$m by Kawaguchi et al. See, for example *IEEE Journal of Quantum Electronics,* QE-13, pp. 556-560, 1977. However, as interest in long wavelength systems increased as previously discussed, lasers capable of being modulated with very large bandwidths for applications in very high bit rate transmission systems have been sought at long wavelengths. Kaminow et al fabricated InGaAsP ridge waveguide lasers with impressive device characteristics. See, for example, *Electronics Letters,* 15, pp. 763-764, 1979. Lasers fabricated using the InGaAsP materials system can emit radiation in the desired long wavelength region. Kaminow obtained a remarkably flat frequency response to 4.5 GHz which was a direct result of not using reverse biased p-n junctions for current injection confinement as do many other laser structures.

However, present techniques for fabricating InGaAsP ridge waveguide lasers are unfortunately rather complex. In one representative embodiment, such lasers comprise an InGaAsP quaternary active layer and InGaAsP cladding layers on opposed major surfaces of the active layer. All epitaxial layers are grown lattice matched to an n-bype InP substrate. It will be understood by the skilled artisan that the term InGaAsP as used herein refers to a materials system and that the active and cladding layers have different compositions. A p-type InP layer is grown on the cladding layer farthest from the n-type InP substrate. However, the p-type InP layer must be etched down to the InGaAsP anti-meltback or cladding layer to form the ridge waveguide. It is desirable that the waveguide have a width less than 5 $\mu$m to ensure fundamental transverse mode operation. After etching, the top surface of the structure is covered with an insulator, such as silicon nitride, and a contact stripe window opened on the top of the narrow ridge. A final metallization is then made. As will be readily appreciated by those skilled in the art, these fabrication procedures require precise control of both the etching and the stripe alignment steps. Such precise control is often difficult to achieve.

Other device characteristics of lasers are also often of interest for communications systems. Although the spectral output of semiconductor diode lasers is relatively narrow as compared to that of, for example, light emitting diodes, the dispersion characteristics of the fiber are such that system capacity is frequently not maximized unless the laser emits radiation in a single longitudinal mode, i.e., the intensity of the unwanted modes is greatly suppressed with respect to the intensity of the desired mode. Such lasers are typically referred to by those skilled in the art as a single frequency laser although the spectral output has, of course, a finite width.

Several approaches have been taken in attempts to fabricate single frequency lasers. For example, there are coupled cavity lasers. Such lasers may have a single section laser with an external cavity or they may be a two-section diode laser with the two sections separated by, for example, a cleave. See, for example, W. T. Tsang, N. A. Olsson, R. A. Logan, *Applied Physics Letters,* 42, pp. 650-652, 1983 which describes a cleaved coupled cavity laser.

Another approach is frequency selective feedback in which the wavelength of the emitted radiation is selected by means of grating. In one version of a frequency selective feedback laser, the grating is fabricated close to the semiconductor active layer. Such lasers are commonly referred to by those skilled in the art as distributed feedback (DFB) lasers. Fabrication of DFB lasers is presently difficult because the composition and thickness of the active layer have to be precisely controlled with respect to the grating period as the grating should enhance radiation at the peak of the laser gain profile. Also, the grating quality must be preserved in all processing steps subsequent to its fabrication. This is often difficult because many fabrication techniques require growing semiconductor lasers directly over the grating. Of course, the problems previously discussed with respect to ridge waveguide lasers are also present in the fabrication of ridge waveguide DFB lasers.

SUMMARY OF THE INVENTION

A method of making a new laser structure which is termed the Heteroepitaxial Ridge-Overgrown (HERO) laser is described. The structure comprises an active layer disposed between first and second cladding layers having first and second conductivity types, respectively. The second cladding layer is covered, except for a stripe opening, with a dielectric layer. The structure further comprises a semiconductor ridge waveguide contacting the second cladding layer which is grown through the stripe opening. The ridge waveguide laser device is fabricated by growing a first cladding layer having a first conductivity type, an active layer, a second cladding layer having a second conductivity type, forming a dielectric layer having a stripe opening, growing a ridge in said opening, and metallizing said dielectric layer and ridge and said substrate. In one embodiment, the forming step comprises covering said second cladding layer with a dielectric layer and forming a stripe opening in said dielectric layer which exposes the surface of said second cladding layer. In one exemplary embodiment, the ridge overgrows a portion of the dielectric layer. The entire surface is metallized to form the ohmic contact to the ridge and the substrate is also metallized to form a contact. The structure further comprises means for forward biasing the p-n junction. In a further exemplary embodiment, the second cladding layer further comprises a distributed feedback grating comprising a plurality of grooves extending in a direction perpendicular to the longitudinal dimension of the stripe with the dielectric layer being deposited over the grooved surface. The resulting structure is a distributed feedback (DFB) laser. In another exemplary embodiment, a distributed feedback grating comprising a plurality of grooves extending in a direction perpendicular to the longitudinal dimension of the stripe is formed in the second cladding layer before the dielectric layer is deposited.

DETAILED DESCRIPTION

Figure 1:
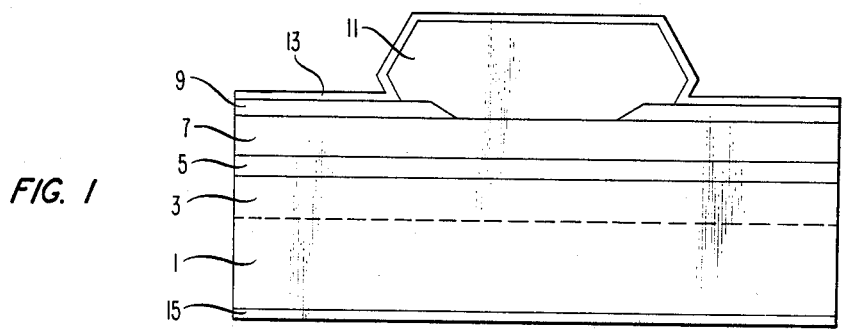
FIG. 1 is an end view of a ridge waveguide laser fabricated according to our invention.

An end view of a ridge waveguide laser fabricated according to our invention is depicted in FIG. 1. For reasons of clarity, the elements of the device are not drawn to scale in this as well as in other Figures. The device comprises substrate 1 having a first conductivity type, a first cladding layer 3, active layer 5, second cladding layer 7, dielectric layer 9, semiconductor ridge 11, and metallization layers 13 and 15. Metallization layers 13 and 15 contact the dielectric layer and ridge, and the substrate, respectively. The resulting ohmic contacts permit a forward bias voltage to be applied. When the current to the active layer is above threshold, the active layer emits radiation along the long axis of the active layer. There are thus electrical contacts to the ridge and the first cladding layer. The ridge contacts the second cladding layer through a stripe opening in the dielectric layer. The ridge need not contact the second cladding layer as intermediate layers may be present. The first and second cladding layers have first and second conductivity types, respectively. The ridge has the second conductivity type. The active layer 5 may have either conductivity type.

The substrate, cladding layers and ridge comprise semiconductors such as Group III-V or Group II-VI compound semiconductors. For example, the cladding layers may comprise InP and the active layer may comprise a quaternary such as InGaAsP. Additionally, the cladding layers may comprise one InGaAsP alloy composition and the active layer may comprise another InGaAsP alloy composition having a narrower bandgap than do the cladding layers. For all compositions, the first and second cladding layers have first and second bandgaps, respectively, and the active layer has a third bandgap which is smaller than the first or second bandgap. The cladding layers and ridge, i.e., the epitaxial layers, are at least approximately lattice matched to the substrate. The dielectric layer may comprise an oxide such as silicon dioxide or other dielectrics such as silicon nitride.

The structure may be fabricated by the following method. The epitaxial layers, except the ridge layer, are epitaxially grown in a well-known manner on the substrate. An insulating film of, for example, $SiO_2$ or $Si_3N_4$, is then deposited by, for example, chemical vapor deposition on the exposed surface of the second cladding layer. Using well-known and conventional lithographic techniques, a window stripe is then etched through the dielectric layer to expose the surface of the second cladding layer. The structure is then reintroduced into the crystal growth apparatus, such as a liquid phase epitaxy reactor or vapor phase epitaxy reactor, for growth of the ridge in the window stripe. No growth occurs on the oxide mask, thus resulting in an oxide restricted ridge waveguide structure. However, if the epitaxial growth is allowed to continue, a thicker ridge is obtained, as shown in FIG. 1, with lateral overgrowth extending beyond the window stripe and over the dielectric layer along the stripe edges. Finally, the entire top surface is metallized as is the exposed substrate surface. It should be noted that the top metallization automatically results in current injection confinement to the ridge overgrowth structure.

In one exemplary embodiment, the first cladding layer was 3.0 $\mu$m thick and comprised InP; the active layer was 0.3 $\mu$m thick and comprised InGaAsP ($\lambda = 1.5$ $\mu$m); the second cladding layer was 0.3 $\mu$m thick and comprised InGaAsP ($\lambda = 1.3$ $\mu$m). The first and second conductivity types were n-type and p-type, respectively. The dielectric layer comprised a 0.15 $\mu$m thick layer of $SiO_2$ and the window stripe was 5 $\mu$m wide.

Several characteristics of the structure depicted should be noted. Lateral growth of the ridge extends over the oxide film restricting the dimensions of the window stripe. The extent of lateral growth appears symmetric on both sides of the ridge and is in intimate contact with the oxide surface. The thickness of the oxide film is tapered, as shown in FIG. 1, near the edges, i.e., near the ridge, because the window stripe is formed by chemical etching. These characteristics loosen the lateral confinement of the optical field which extends beyond the window stripe into a portion of the second cladding layer underneath the oxide layer. This results in a narrower lateral beam divergence for the same window stripe width than would result if the optical field were more tightly confined. It should also be noted that because of the lateral overgrowth, the lateral evanescent field does not suffer optical absorption by the metal film on top of the oxide film as it does for conventional etched ridge waveguide lasers with a thin oxide film.

It should be furthr noted tht the ohmic contact is formed over all the exposed surfaces of the grown ridge, and that all of the injected current passes through only the narrow window stripe. As a result, the current density at the semiconductor-metal interface is greatly reduced. Furthermore, surface current leakage may be reduced as the surfaces are as grown rather than etched.

The surface of the structure, except for the narrow window stripe, is covered with an oxide film when growth of the ridge begins. As a result, the rate of material deposition in the stripe is very rapid when growth begins. For example, a ridge thickness of 3 μm was grown in 5 seconds with a growth temperature of 600 degrees C and a cooling rate of 2 degrees C/sec. These conditions result in a very uniform ridge overgrowth which is independent of the orientation of the window stripe along the (1$\bar{1}$0) or ($\bar{1}$10) direction. It is noted that those growth conditions also result in negligible meltback of the InGaAsP material in the window stripe.

Figure 2:
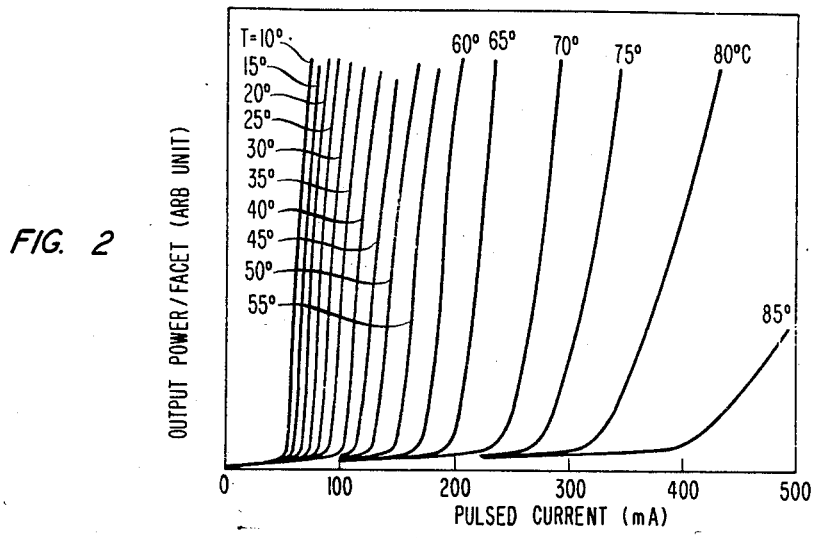
FIG. 2 plots the output power per facet in units of mW vertically versus the pulsed current in units of mA horizontally.

FIG. 2 plots the light-current characteristics of a typical laser according to our invention for several operating temperatures. The output power per facet in arbitrary units is plotted vertically versus the pulsed current in units of mA plotted horizontally. The operating temperatures in units of degrees C are shown for each curve. The laser had a 1.5 μm InGaAsP active layer. Output powers as high as 50 mW/facet were obtained and the external differential quantum efficiencies from both facets were approximately 25 to 35 percent. The lowest current threshold for lasers with a 5 μm stripe and a 250 μm long cavity was 70 mA. Very stable far field patterns were obtained. At powers up to approximately 30 mW/facet, the half powers at full width beam divergence was approximately 12 degrees. It should be noted that this value is smaller than those obtained with etched ridge waveguide lasers.

Figure 3:
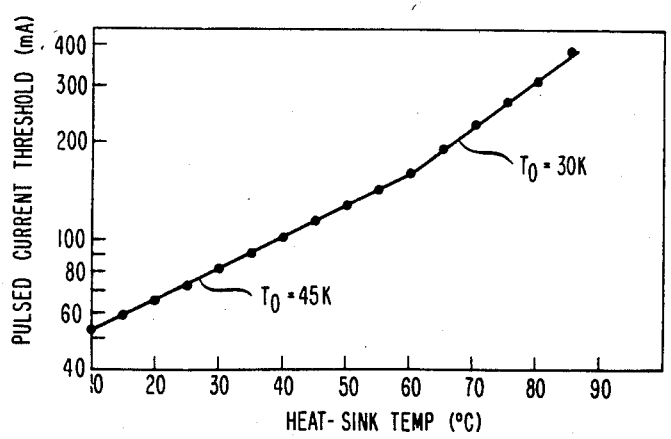
FIG. 3 plots the heat sink temperature horizontally in units of degrees C versus the threshold current vertically in units of mA.

FIG. 3 plots the heat sink temperature horizontally in units of degrees C versus the threshold current vertically in units of mA. A temperature coefficient, $T_o$, of 45 degrees K was obtained for low heat sink temperatures.

Figure 4:
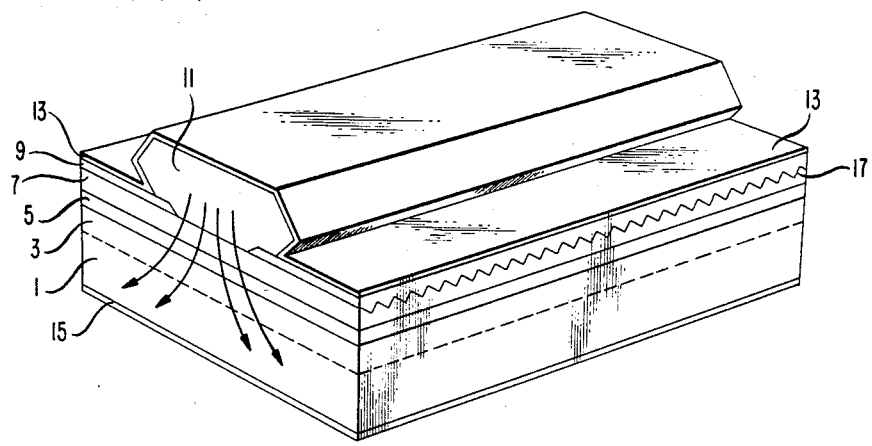
FIG. 4 is a perspective view of a ridge waveguide distributed feedback (DFB) laser fabricated according to our invention.

An exemplary embodiment of a DFB laser is depicted in perspective in FIG. 4. Numerals identical to those in FIG. 1 represent identical elements. The arrows indicate the direction of current flow for a laser with an n-type substrate and a p-type ridge. In this embodiment of the ridge overgrown laser, the second cladding layer further comprises a distributed feedback grating 17 comprising a plurality of grooves with the grooves running in a direction perpendicular to the longitudinal dimension of the ridge. As is evident, the oxide layer conforms to the grooves.

The semiconductor surface is conveniently corrugated, that is, the grooves are fabricated and the grating formed, after the first epilayer growth cycle, i.e., after the second cladding layer has been grown. However, room temperature photoluminescence and layer thickness measurements are conveniently used to determine the required grating period at this point in the fabrication sequence. The ability to determine the grating period after the initial layered structure has been grown is desirable because the appropriate grating period for the distributed feedback laser may be precisely determined and fabricated. Photolithography and chemical etching may be used to form the grooves. Exemplary values for the grating period and depth are 4300 and 1000 Angstroms, respectively, for a 0.3 μm thick, λ=1.5 μm InGaAsP active layer with a 3 μm thick InP first cladding layer and a 0.3 μm thick, λ=1.3 InGaAsP second cladding layer. The direction of the grooves was <$\bar{1}$10>. After the grooves have been fabricated, the dielectric layer is deposited and window stripes etched to the surface of the second cladding layer. An exemplary value for the dielectric layer thickness is 0.15 μm. The structure is then reintroduced into the liquid phase epitaxy or vapor phase epitaxy reactor for overgrowth of the ridge. Surface corrugation within the stripe may be preserved by carrying out the overgrowth at a low temperature and rapid cooling rate such as those previously mentioned for ridge growth. Under these conditions, no melt back was observed. The seeding effect previously described appears important in assisting preservation of the surface corrugation. However, it should be noted that even if the surface corrugation in the window stripes is either degraded or completely melted away because of either pregrowth thermal mass transport or meltback during growth, the grating adjacent to the stripe is protected under the oxide film. The interaction of the lateral evanescent field with the corrugation still provides sufficient distributed feedback. This structure may be termed a Lateral Evanescent Field-Distributed Feedback (LEF-DFB) laser.

The lateral overgrowth described appears particularly important in a DFB laser. The extent of the lateral growth is symmetric on both sides of the stripe and is in contact with the oxide surface. The lateral optical confinement extends into the grating periods under the oxide layer and results in increased distributed feedback because of the lateral evanescent field as well as narrower lateral beam divergence. In the vertical direction, the overgrowth over the oxide also increases the evanescent field intensity at the grating-oxide interface and results in a stronger electric field interaction with the grating. It should also be noted that the oxide has an index of refraction of approximately 1.45 and the insertion of the oxide between the overgrowth and the corrugated surface increases the grating effect, or coupling coefficient, of the lateral evanescent field gratings. It is additionally noted that the presence of the oxide spacer layer in the evanescent electric field regions should significantly increase mode discrimination thus leading to stronger single longitudinal mode operation when even order gratings are used.

Figure 5:
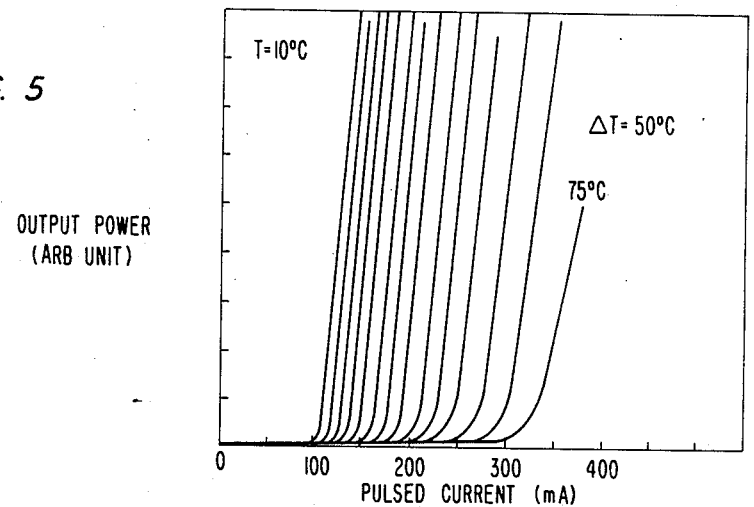
FIG. 5 plots the output power in arbitrary units vertically versus the pulsed current horizontally in units of mA for a DFB laser at various heat sink temperatures.

FIG. 5 plots the pulsed current horizontally in units of mA versus the output power vertically in arbitrary units for a DFB laser. The heat sink temperature increases by 5 degrees C between curves with the left and right curves being at temperatures of 10 and 75 degrees C, respectively.

Figure 6:
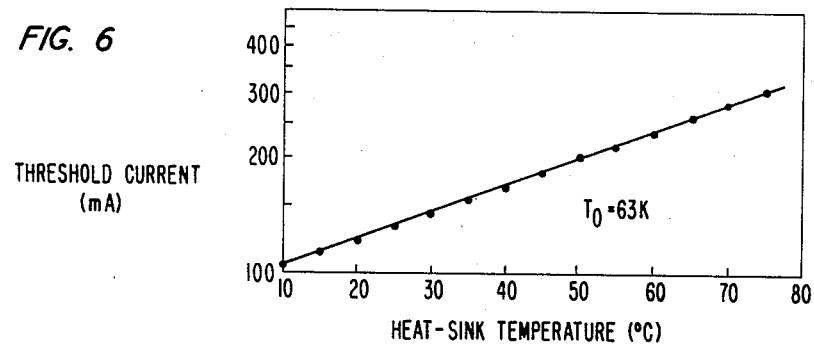
FIG. 6 plots the heat sink temperature horizontally in units of degrees C versus the threshold current vertically in units of mA for a DFB laser.

The heat sink temperature is plotted horizontally in units of degrees C versus the threshold current in units of mA vertically in FIG. 6. Single longitudinal mode operation was obtained over this entire temperature range. However, the secondary mode suppression ratios did vary. A well-behaved temperature coefficient, $T_o$, of 63 degrees K was obtained.

Figure 7:
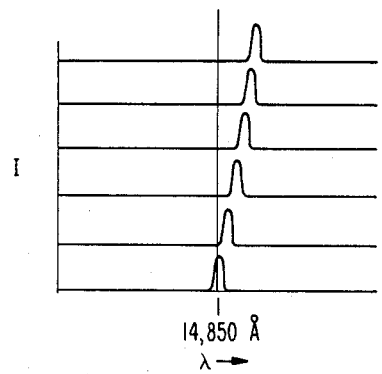
FIG. 7 plots the output spectra for different heat sink temperatures for a DFB laser.
Figure 8:
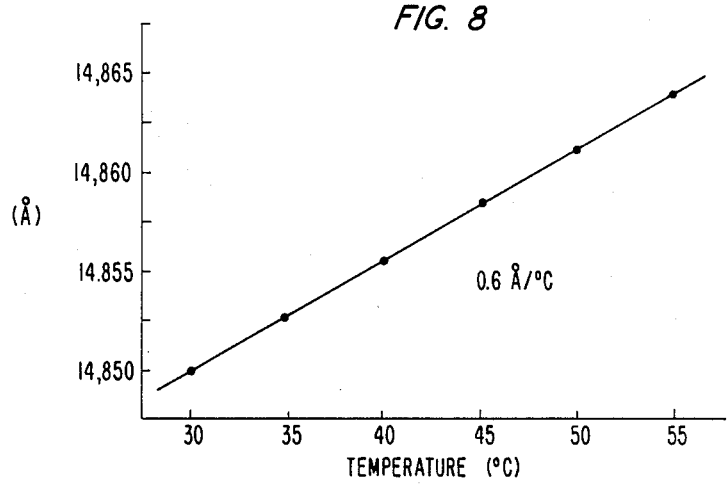
FIG. 8 plots the emission wavelength vertically in units of Angstroms versus the heat sink temperature horizontally in units of degrees C for a DFB laser.

Pulsed spectra taken at different temperatures between 30 and 55 degrees C illustrated that the DFB laser operated in the same single longitudinal mode although the lasing wavelength increased by approximately 0.6 Angstroms/degrees C. The spectra are plotted in FIG. 7 for heat sink temperatures of 30, 35, 40, 45, 50 and 55 degrees C. The variation in lasing wavelength as a function of heat sink temperature is depicted in FIG. 8. The heat sink temperature is plotted horizontally in units of degrees C versus the lasing wavelength vertically in units of Angstroms.

Figure 9:
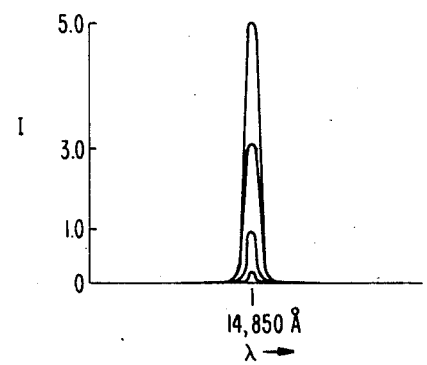
FIG. 9 plots the output spectra at different output power levels for a DFB laser.

Pulsed spectra are plotted in FIG. 9 for output power levels of 0.3, 1.0, 3.0 and 5.0 mW. As is evident, the output is a single longitudinal mode centered at approximately 1.485 μm. Stable single longitudinal mode output was maintained up to a power level of typically approximately 8 mW/facet. However, at higher powers, the intensity of the unwanted secondary modes became significant. It should be pointed out however that these measurements were made without the use of an anti-reflection coating on the facet. With an anti-reflection coating, the single mode output power typically can be doubled and the ratio of the primary to secondary mode intensities also increased.

It was also found that single-mode operation was stable under fast pulsed modulation up to approximately 2 Gb/sec. This rate represents the limit of the test apparatus used rather than any limitation in the laser structure tested.

Examination of the spectra with the laser under pseundo random word generation of 2 Gb/sec and a peak power of approximately 5 mW/facet showed that the unwanted secondary modes were suppressed by a ratio of approximately 1000:1 with respect to the primary mode. The dynamic spectral width was measured to be approximately within the range from 0.5 to 2 Angstroms.

What is claimed is:

1. A method of making a laser comprising the steps of growing, on a substrate, a first cladding layer having a first conductivity type, an active layer, a second cladding layer having a second conductivity type, forming a dielectric layer with a stripe opening exposing said second cladding layer, growing a ridge in said opening, and metallizing said dielectric layer and ridge and said substrate.

2. A method as recited in claim 1 in which said forming step comprises covering said second cladding layer with a dielectric layer, patterning a stripe opening in said dielectric which exposes the surface of said second cladding layer.

3. A method of making a laser as recited in claim 2 in which said layers and ridge comprise semiconductors selected from the group consisting of Group II-VI and Group III-V compound semiconductors.

4. A method of making a laser as recited in claim 3 in which said dielectric layer has a refractive index less than of said semiconductors.

5. A method of making a laser as recited in claim 4 in which said dielectric layer comprises material selected from the group consisting of $SiO_2$ and $Si_3N_4$.

6. A method of making a laser as recited in claim 5 in which said ridge extends laterally over said dielectric layer.

7. A method of making a laser as recited in claim 1 comprising the further step of fabricating a distributed feedback grating in said second cladding layer.

8. A method of making a laser as recited in claim 7 in which said distributed feedback grating comprising a plurality of grooves perpendicular to the longitudinal dimension of said ridge.

9. A method as recited in claim 7 in which said forming step comprises covering said second cladding layer with a dielectric layer, patterning a stripe opening in said dielectric which exposes the surface of said second cladding layer.

10. A method of making a laser as recited in claim 9 in which said layers and ridge comprise semiconductors selected from the group consisting of Group II-VI and Group III-V compound semiconductors.

11. A method of making a laser as recited in claim 10 in which said dielectric layer has a refractive index less than of said semiconductor.

12. A method of making a laser as recited in claim 11 in which said dielectric layer comprises material selected from the group consisting of $SiO_2$ and $Si_3N_4$.

13. A method of making a laser as recited in claim 12 in which said ridge extends laterally over said dielectric layer.

* * * * *